US012810036B2

(12) United States Patent
Schaefer et al.

(10) Patent No.: US 12,810,036 B2
(45) Date of Patent: Nov. 24, 2026

(54) METHOD AND SYSTEM FOR ESTIMATING STRUCTURAL DAMAGE TO A BONDED JOINT

(71) Applicant: The Boeing Company, Chicago, IL (US)

(72) Inventors: Joseph D. Schaefer, Richmond Heights, MO (US); Brian P. Justusson, Saint Peters, MO (US); Mainak Bhattacharya, Bangalore (IN)

(73) Assignee: The Boeing Company, Arlington, VA (US)

( * ) Notice: Subject to any disclaimer, the term of this patent is extended or adjusted under 35 U.S.C. 154(b) by 1136 days.

(21) Appl. No.: 17/726,080

(22) Filed: Apr. 21, 2022

(65) Prior Publication Data

US 2023/0342514 A1 Oct. 26, 2023

(51) Int. Cl.

*G06F 30/15* (2020.01)
*B64C 1/06* (2006.01)
*G06F 30/23* (2020.01)

(52) U.S. Cl.

CPC ................ *G06F 30/15* (2020.01); *B64C 1/06* (2013.01); *G06F 30/23* (2020.01)

(58) Field of Classification Search

CPC ............ G06F 30/15; G06F 30/23; B64C 1/06
See application file for complete search history.

(56) References Cited

U.S. PATENT DOCUMENTS 6,384,610 B1 * 5/2002 Wilson ................... G01N 17/02 324/663
9,261,444 B1 * 2/2016 Sutherland ............... G01N 3/30
2005/0022152 A1 * 1/2005 Turk ....................... G06F 30/15 717/100
2018/0340858 A1 11/2018 Jahanbin et al.
2025/0102468 A1 3/2025 Jack et al.

OTHER PUBLICATIONS

M.M.A. Wahab, I. A. Aschcroft, A. D. Crocombe, P. A. Smith, "Finite element prediction of fatigue crack propagation lifetime in composite bonded joints" pp. 213-222, 2003. (Year: 2003).*

J. Y. Cognard, P. Davies, L. Sohier, R. Creac'hcadec, "A study of the non-linear behaviour of adhesively-bonded composite assemblies", pp. 34-46, 2006 (Year: 2006).*

* cited by examiner

*Primary Examiner* — Kibrom K Gebresilassie
(74) *Attorney, Agent, or Firm* — Harrity & Harrity, LLP

(57) ABSTRACT

A computer-implemented method facilitates receiving, by a computing system, one or more parameters that specify attributes associated with a bonded joint and, in particular, a type of bonded joint. The computing system selects from a model template repository one or more bonded joint model templates associated with the type of bonded joint. The computing system generates a bonded joint model based on the bonded joint model templates and the parameters. The bonded joint model facilitates the performance of finite element analysis (FEA). FEA logic of the computing system simulates the application of stress to the bonded joint model. The FEA logic of the computing system determines a change in a size of a defect that results from the application of stress to the bonded joint model. The computing system determines, based on the change in the size of the defect, the life expectancy of the bonded joint.

20 Claims, 13 Drawing Sheets

600

630

660

METHOD AND SYSTEM FOR ESTIMATING STRUCTURAL DAMAGE TO A BONDED JOINT

BACKGROUND

Field

This application generally relates to the analysis of structural components of aircraft. In particular, this application describes example methods and systems that facilitate estimating structural damage to and/or within a bonded joint.

Description of Related Art

Aircraft maintenance teams usually rely on manual inspection of an aircraft's structure to assess whether there are any structural defects with the aircraft that could impact the aircraft's performance. Some of these structures include joints that facilitate attaching different structures to one another. For example, the joint that couples the aircraft's wing to the fuselage may have or develop a defect. If left unchecked, the defect may grow with repeated application of stress to the point that catastrophic failure of the joint is imminent.

One type of joint used to couple the wing to the fuselage is a step lap joint. Some examples of the step lap joint include first and second members that define complementary steps configured to overlap the steps of the other member. However, detecting some defects that can occur to these joints is impractical. For example, defects that begin between the members (e.g., at the bondline between the members) are not readily visible. Inspection of the defect, in this case, may require the removal of the wing from the fuselage, which is undesirable. The removed wing may then be brought to a different facility with equipment capable of detecting defects between the members.

SUMMARY

In a first aspect, a computer-implemented method that facilitates determining a life expectancy of a bonded joint comprises receiving, by a computing system, one or more parameters that specify attributes associated with a bonded joint and, in particular, a type of bonded joint. The computing system selects from a model template repository one or more bonded joint model templates associated with the type of bonded joint. The computing system generates a bonded joint model based on the one or more bonded joint model templates and the one or more parameters. The bonded joint model facilitates the performance of finite element analysis (FEA). FEA logic of the computing system simulates the application of stress to the bonded joint model. The FEA logic of the computing system determines a change in a size of a defect that results from the application of stress to the bonded joint model. The computing system determines, based on the change in the size of the defect, the life expectancy of the bonded joint.

In a second aspect, a computing system that facilitates determining a life expectancy of a bonded joint comprises one or more instruction storage devices for storing instruction code; and one or more processors in communication with the one or more instruction storage devices. Execution of the instruction code by the processors causes the computing system to perform operations comprising receiving, by the computing system, one or more parameters that specify attributes associated with a bonded joint and, in particular, a type of bonded joint. The computing system selects from a model template repository one or more bonded joint model templates associated with the type of bonded joint. The computing system generates a bonded joint model based on the one or more bonded joint model templates and the one or more parameters. The bonded joint model facilitates the performance of finite element analysis (FEA). FEA logic of the computing system simulates the application of stress to the bonded joint model. The FEA logic of the computing system determines a change in a size of a defect that results from the application of stress to the bonded joint model. The computing system determines, based on the change in the size of the defect, the life expectancy of the bonded joint.

In a third aspect, a non-transitory computer-readable medium stores instruction code that facilitates determining a life expectancy of a bonded joint. Execution of the instruction code by one or more processors of a computing system causes the computing system to perform operations comprising receiving, by the computing system, one or more parameters that specify attributes associated with a bonded joint and, in particular, a type of bonded joint. The computing system selects from a model template repository one or more bonded joint model templates associated with the type of bonded joint. The computing system generates a bonded joint model based on the one or more bonded joint model templates and the one or more parameters. The bonded joint model facilitates the performance of finite element analysis (FEA). FEA logic of the computing system simulates the application of stress to the bonded joint model. The FEA logic of the computing system determines a change in a size of a defect that results from the application of stress to the bonded joint model. The computing system determines, based on the change in the size of the defect, the life expectancy of the bonded joint.

The foregoing summary is illustrative only and is not intended to be in any way limiting. In addition to the illustrative aspects, embodiments, and features described above, further aspects, embodiments, and features will become apparent by reference to the figures and the following detailed description and the accompanying drawings.

DETAILED DESCRIPTION

Figure 1:
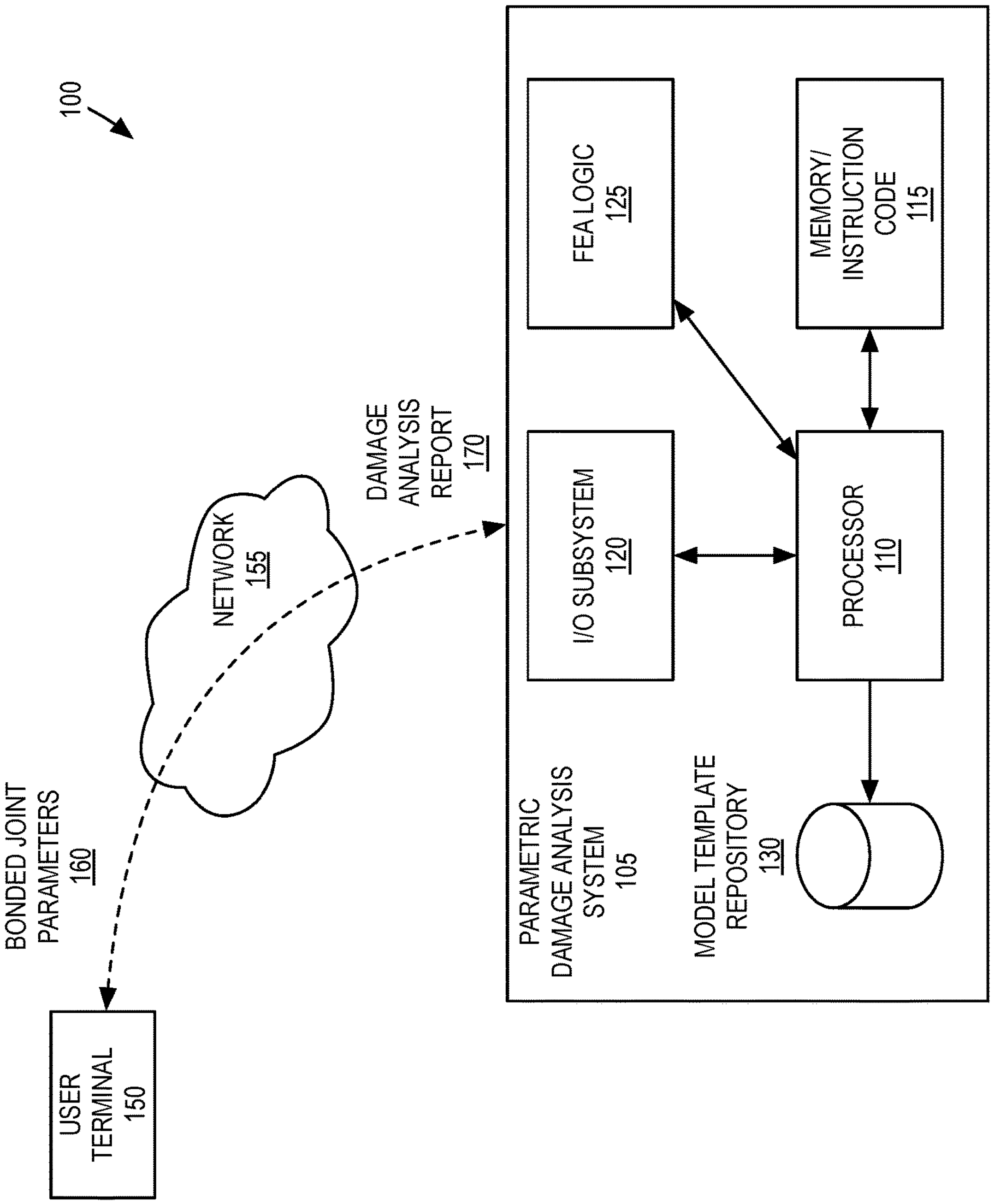
FIG. 1 illustrates an environment that includes various systems/devices that cooperate to facilitate estimating structural damage to a bonded joint, in accordance with example embodiments.

Various examples of systems, devices, and/or methods are described herein. Any embodiment, implementation, and/or feature described herein as being an example is not necessarily to be construed as preferred or advantageous over any other embodiment, implementation, and/or feature unless stated as such. Thus, other embodiments, implementations, and/or features may be utilized, and other changes may be made without departing from the scope of the subject matter presented herein.

Accordingly, the examples described herein are not meant to be limiting. It will be readily understood that the aspects of the present disclosure, as generally described herein, and illustrated in the figures, can be arranged, substituted, combined, separated, and designed in a wide variety of different configurations.

Further, unless the context suggests otherwise, the features illustrated in each of the figures may be used in combination with one another. Thus, the figures should be generally viewed as component aspects of one or more overall embodiments, with the understanding that not all illustrated features are necessary for each embodiment.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

Moreover, terms such as "substantially" or "about" that may be used herein are meant that the recited characteristic, parameter, or value need not be achieved exactly, but that deviations or variations, including, for example, tolerances, measurement error, measurement accuracy limitations and other factors known to those skilled in the art, may occur in amounts that do not preclude the effect the characteristic was intended to provide.

INTRODUCTION

As noted above, detecting some defects that can occur to bonded joints is impractical. For example, defects that begin between the members of the bonded joint (e.g., at the bondline between the members) are not readily visible. Inspection of the defect, in this case, may require the removal of the wing from the fuselage. The removed wing must then be brought to a facility with equipment capable of detecting defects between the members, which can be impractical. In particular, fleet level NDI is typically involves ultrasonic scanning and is only able to capture quarter inch damage size, which misses anything below that length scale. Further, for wing and pylon applications, only one side of the joint can be evaluated, leaving the entirety of the inner joint bondline unable to be assessed. That necessitates removing the wing to perform the inspection. This is a highly disadvantageous situation for aircraft on carriers, where this problem mainly originates. These and other issues are ameliorated by various examples of parametric damage analysis systems (PDAS) and methods described herein.

Some examples of the PDAS facilitate estimating structural damage to and/or within a bonded joint. Some examples of the bonded joint are representative of aircraft structural components. In this regard, some examples of the PDAS facilitate estimating the life expectancy of a bonded joint after the application of static and fatigue stress (e.g., based on predictions for residual strength, stiffness, damage size increase, etc.). Some examples of the PDAS facilitate making these determinations for bonded joints that are in pristine condition and for bonded joints that have defects (e.g., disbonds, cracks, etc.) In some examples, the bonded joints are specified by 3-dimensional parametric models. Some examples of these bonded joint models specify single strap, double strap, and step lap bonded joints. This facilitates establishing structural capabilities within the design test certification building block as established by joint durability and damage tolerance requirements. Some examples of the bonded joint models are configured to model bulk laminate materials, ply-by-ply materials, and co-cured interfaces in a parametric fashion using linear elastic and nonlinear constitutive laws. In this regard, some examples of the bonded joint model are configured to model linear and nonlinear behaviors of composite materials of the bonded joint. Some examples of the bonded joint model are configured to model linear and nonlinear behaviors of metal materials of the bonded joint and also linear and nonlinear behaviors of the interface between composite plies (e.g., under co-cured conditions) of the bonded joint as well as linear and nonlinear behaviors of the bondline (e.g., when an adhesive is used between materials, such as between composite to composite, between composite to metal, metal to metal, etc.) of the bonded joint. Some examples of the bonded joint model are configured to model linear and nonlinear interface behaviors of adhesives used for bonding members of the bonded joint.

Some particular examples of the PDAS are configured to receive one or more parameters that specify attributes associated with the bonded joint. Some examples of the parameters facilitate specifying a 3-dimensional geometry of the bonded joint. Some examples of the parameters facilitate specifying a type of bonded joint (e.g., single strap shear joint, double strap shear joint, step lap shear joint, etc.). Some examples of the parameters facilitate specifying a starting location of a defect in the bonded joint and, in some examples, an initial size of the defect. In some examples, the starting location of the defect can be specified at a bondline of the bonded joint, between plies of members of the bonded joint, etc. In some examples, starting locations of a plurality of defects are specifiable. In this regard, some examples of the PDAS facilitate specifying defects at different steps of a step lap joint.

Some examples of the PDAS are configured to select one or more model templates associated with the type of bonded joint. Some examples of the model templates are stored in a model template repository. Examples of the model templates are configured to model linear and nonlinear behaviors of composite materials of the bonded joint, linear and nonlinear interface behaviors of metal materials of the bonded joint, and linear and nonlinear interface behaviors of adhesives materials of the bonded joint.

Some examples of the PDAS are configured to generate a bonded joint model based on the model templates and the parameters. Some examples of the bonded joint model facilitate the performance of finite element analysis (FEA). In this regard, some examples of the PDAS implement FEA logic configured to simulate the application of stress to the bonded joint model. The stress to be simulated can correspond to mechanical, thermal, hygric (moisture) or any combination thereof and at any frequency. Some examples of the FEA logic are configured to simulate the application of static loading and/or fatigue loading to the bonded joint model. In this regard, some examples of the parameters described above facilitate the specification of an amount of fatigue loading experienced by the bonded joint. Some examples of the FEA are configured to simulate the application of stress to a bonded joint model that models a bonded joint that has experienced the specified fatigue loading.

Some examples of the FEA logic are configured to determine a change in the size of a defect that occurs from the application of stress to the bonded joint model. In examples where multiple defects are specified, changes in the sizes of each defect are determined. Further, some examples of the FEA logic are configured to predict how the defects grow and interact with one another to potentially combine into larger/more severe defects. The change in the size or sizes of the defect(s) facilitates determining, by the PDAS, the life expectancy of the bonded joint.

FIG. 1 illustrates an example of an environment 100 that includes various systems/devices that cooperate to facilitate estimating structural damage to a bonded joint. Example systems/devices of the environment 100 include a parametric damage analysis system (PDAS) 105 and a user terminal 150 through which a user interacts with the PDAS 105. As described in further detail below, a user, via the user terminal 150, communicates bonded joint parameters 160 that specify a bonded joint to the PDAS 105. In response to receiving this information, the PDAS 105 determines and communicates to the user terminal 105 a damage analysis report 170 associated with a bonded joint specified by the bonded joint parameters 160. Some examples of the PDAS 105 and the user terminal 150 communicate information to one another via a communication network 155, such as the Internet, a cellular communication network, a WiFi network, etc.

Some examples of the PDAS 105 comprise a memory 115, a processor 110, and an input/output (I/O) subsystem 120. Some examples of the PDAS 105 comprise finite element analysis (FEA) logic 125 and a model template repository 130.

The processor 110 is in communication with the memory 115. The processor 110 is configured to execute instruction code stored in the memory 115. The instruction code facilitates performing, by the PDAS 105, various operations that are described below. In this regard, the instruction code may cause the processor 110 to control and coordinate various activities performed by the different subsystems of the PDAS 105. Some examples of the processor 110 correspond to an ARM®, Intel®, AMD®, PowerPC®, etc., based processor. Some examples of the processor 110 are configured to execute an operating system, such as Android™, Windows®, Linux®, Unix®, or a different operating system.

Some examples of the I/O subsystem 120 include one or more input/output interfaces configured to facilitate communications with other systems of the PDAS 105 and/or with entities outside of the PDAS 105. Some examples of the I/O subsystem 120 are configured to communicate information via a RESTful API or a Web Service API. Some examples of the I/O subsystem 120 implement a web browser to facilitate generating one or more web-based interfaces through which users of the PDAS 105 and/or other systems interact with the PDAS 105.

Some examples of the FEA logic 125 are configured to predict how different materials will react when a range of stresses are applied. In this regard, the FEA logic 125 is configured to receive a 3-dimensional (3D) model of a component (e.g., a bonded joint) and to subdivide the 3D model into finite elements (e.g., a collection of smaller, simpler parts). The FEA logic 125 is configured to solve a set of partial differential equations that mathematically apply these stresses to the finite elements to predict how the component will react to the stresses.

Figure 2:
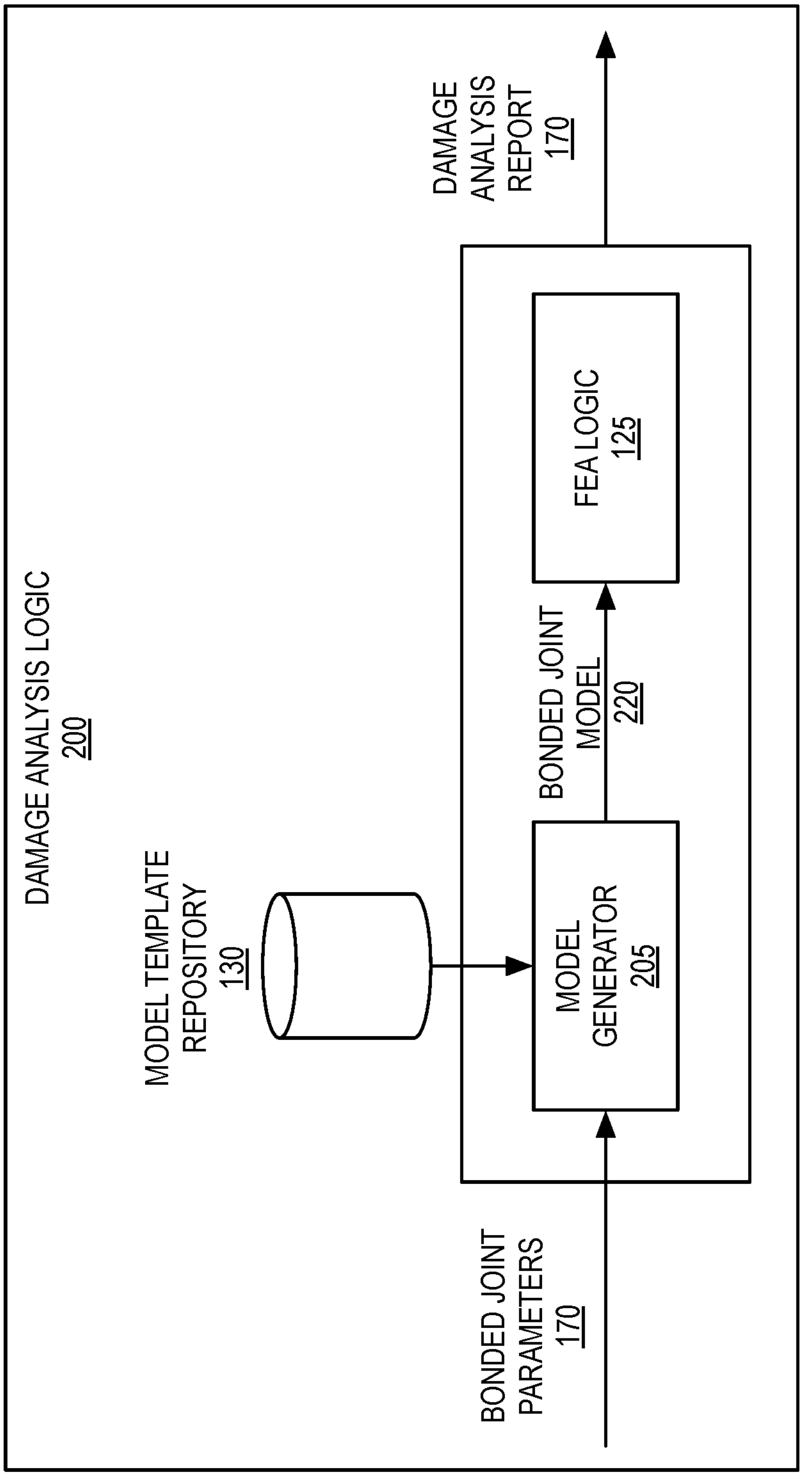
FIG. 2 illustrates logic implemented by a parametric damage analysis system (PDAS) of the environment, in accordance with example embodiments.

FIG. 2 illustrates an overview of logic 200 implemented by some examples of the PDAS 105. As shown, model generator logic 205 is configured to generate a bonded joint model 220 that specifies a 3-D representation of a bonded joint based on bonded joint parameters 160 and a corresponding bonded joint model template stored in the model template repository 130. The bonded joint model 220 is communicated to the FEA logic 125 of the PDAS 105. The FEA logic 125 models changes in the bonded joint model 220 that result from the simulated application of one or more stresses to bonded joint model 220. Changes to the bonded joint model 220 represent changes to an actual bonded joint that would occur when subjected to similar stresses. Some changes to the bonded joint model 220 correspond to defects. Continued application of the simulated stresses causes these defects to grow. Tracking the rate of growth of these defects facilitates estimating the longevity of a bonded joint associated with the bonded joint model 220. Some examples of the damage analysis report communicated by the PDAS 105 specify the longevity of a bonded joint.

Figure 3A:
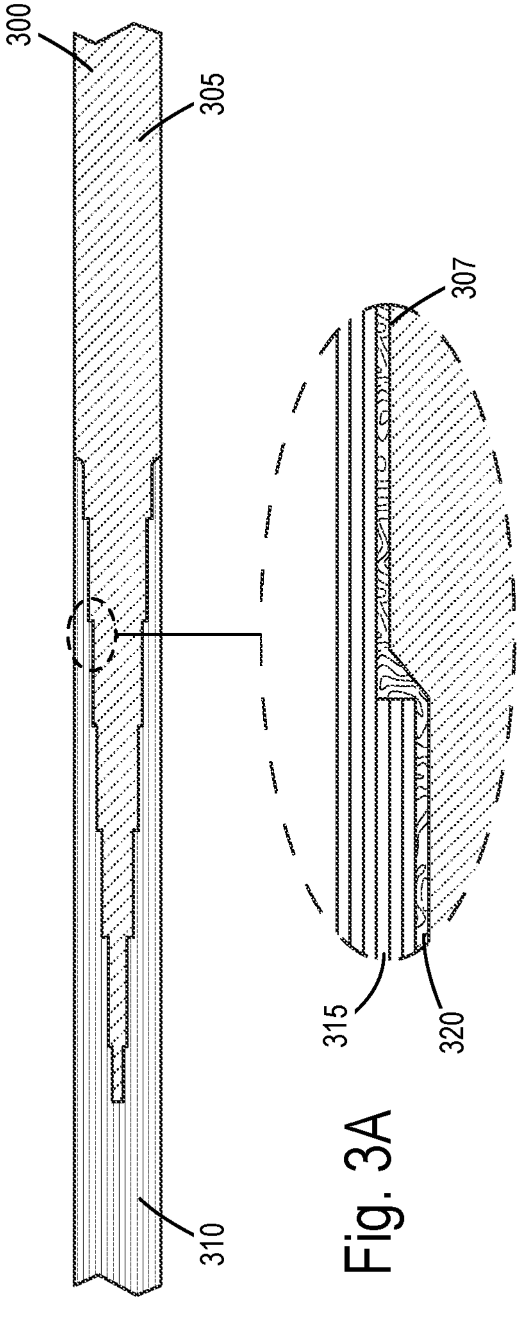
FIG. 3A illustrates a side view of a step lap joint, in accordance with example embodiments.
Figure 3B:
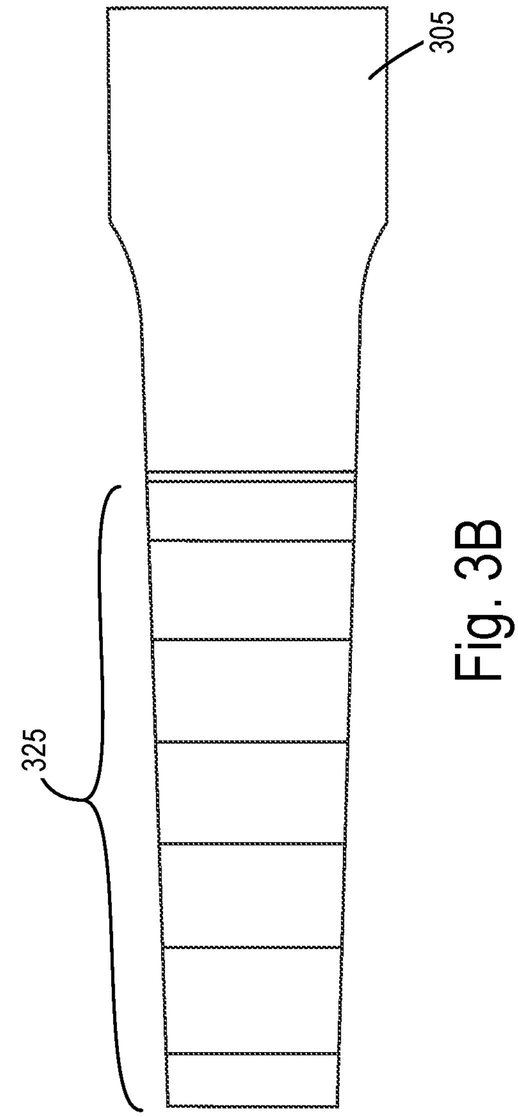
FIG. 3B illustrates a top view of the step lap joint of FIG. 3A, in accordance with example embodiments.

FIGS. 3A-4B illustrate some examples of bonded joints that can be analyzed as described above. FIGS. 3A and 3B illustrate an example of a step lap joint 300. The step lap joint 300 comprises a tine member 305 and a ply member 310. Some examples of the ply member 310 comprise several layered plies 315. Some examples of the plies 315 of the ply member 310 are held together by an adhesive. In some examples, the tine member 305 and the ply member 310 are held together along a bondline 307 by an adhesive layer 320. Some examples of the tine member 305 define a group of steps 325 that are configured to adhesively couple to corresponding steps of the ply member 310.

Figure 4A:
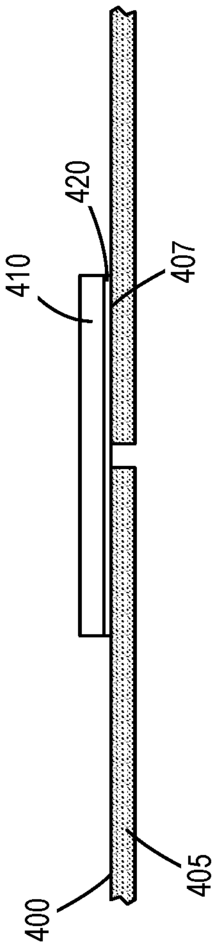
FIG. 4A illustrates a single strap joint, in accordance with example embodiments.

FIG. 4A illustrates an example of a single strap joint 400. The single strap joint 400 includes a pair of parent members 405 and a strap member 410. In some examples, the pair of parent members 405 and the strap member 410 are coupled along a bondline 407 via an adhesive layer 420.

Figure 4B:
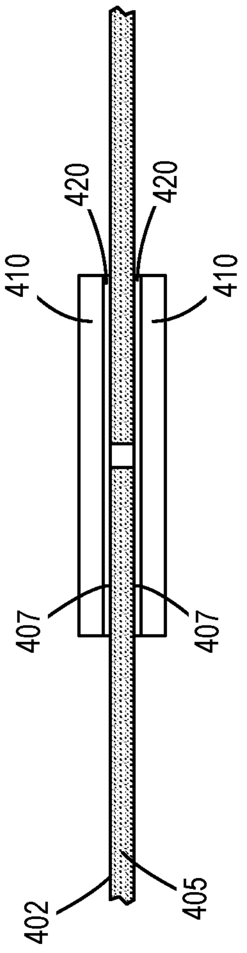
FIG. 4B illustrates a double strap joint, in accordance with example embodiments.

FIG. 4B illustrates an example of a double strap joint 402. The double strap joint 402 includes a pair of parent members 405, a top strap member 415A, and a bottom strap member 415B. In some examples, the pair of parent members 405 and the top strap member 415A and the bottom strap member 415B are coupled along respective bondlines 407 via adhesive layers 420.

Figure 5:
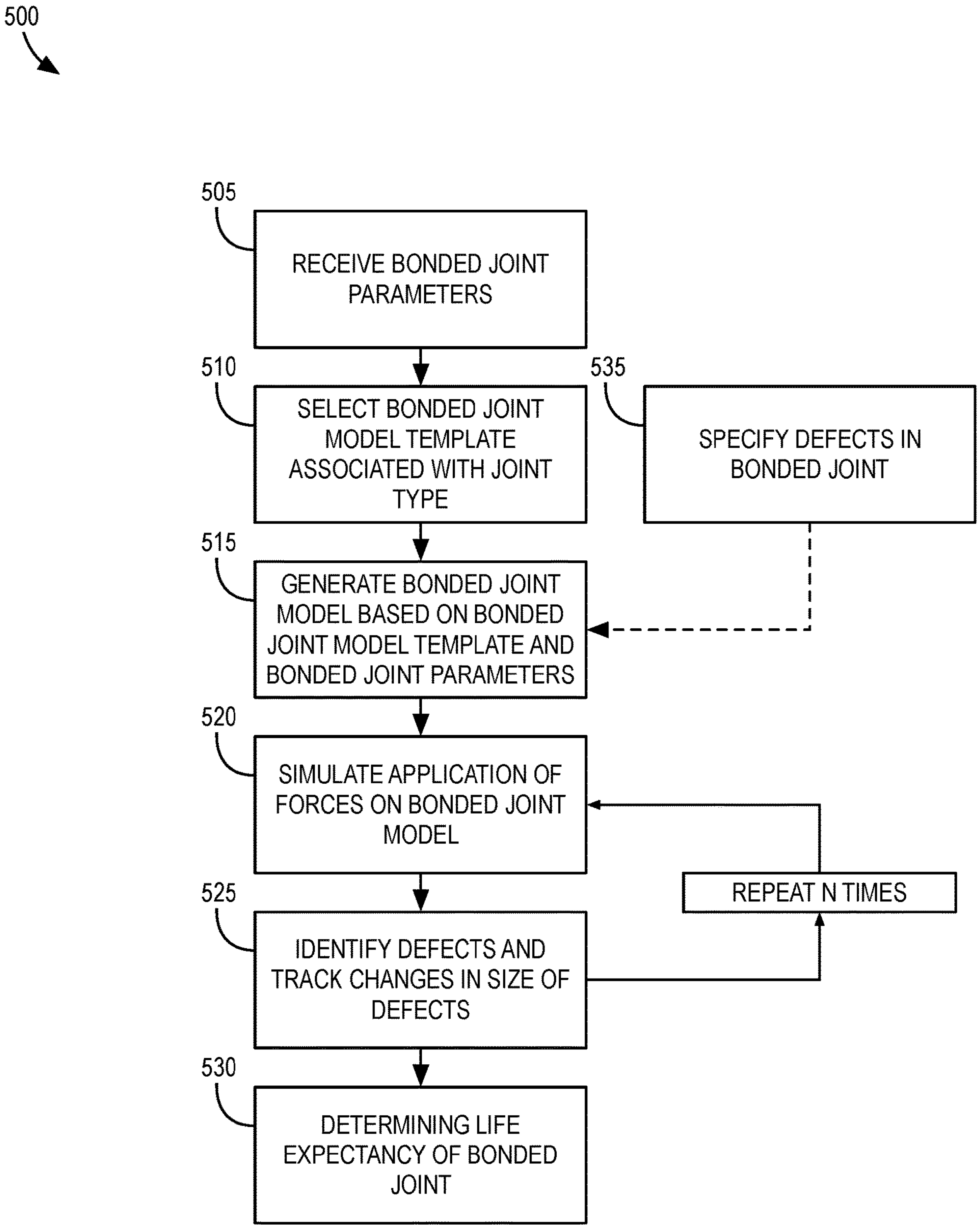
FIG. 5 illustrates operations performed by a PDAS, in accordance with example embodiments.

FIG. 5 illustrates operations 500 performed by some examples of the PDAS 105. In some examples, one or more of these operations are implemented via instruction code, stored in corresponding data storage (e.g., memory 115) of the PDAS 105. Execution of the instruction code by corresponding processors of the devices causes these devices to perform these operations 500 alone or in combination with other devices. The operations 500 are more clearly understood with reference to FIGS. 6A-7C.

The operations at block 505 involve receiving bonded joint parameters 160. Some examples of the bonded joint parameters 160 specify a bonded joint type (e.g., step lap joint, single strap joint, double strap joint, etc.). Some examples of the bonded joint parameters 160 specify geometric parameters associated with the bonded joint type. In this regard, some examples of the PDAS 105 are configured to communicate one or more user interfaces that facilitate the specification of parameters associated with particular bonded joint types to the user terminal 150.

Figure 6A:
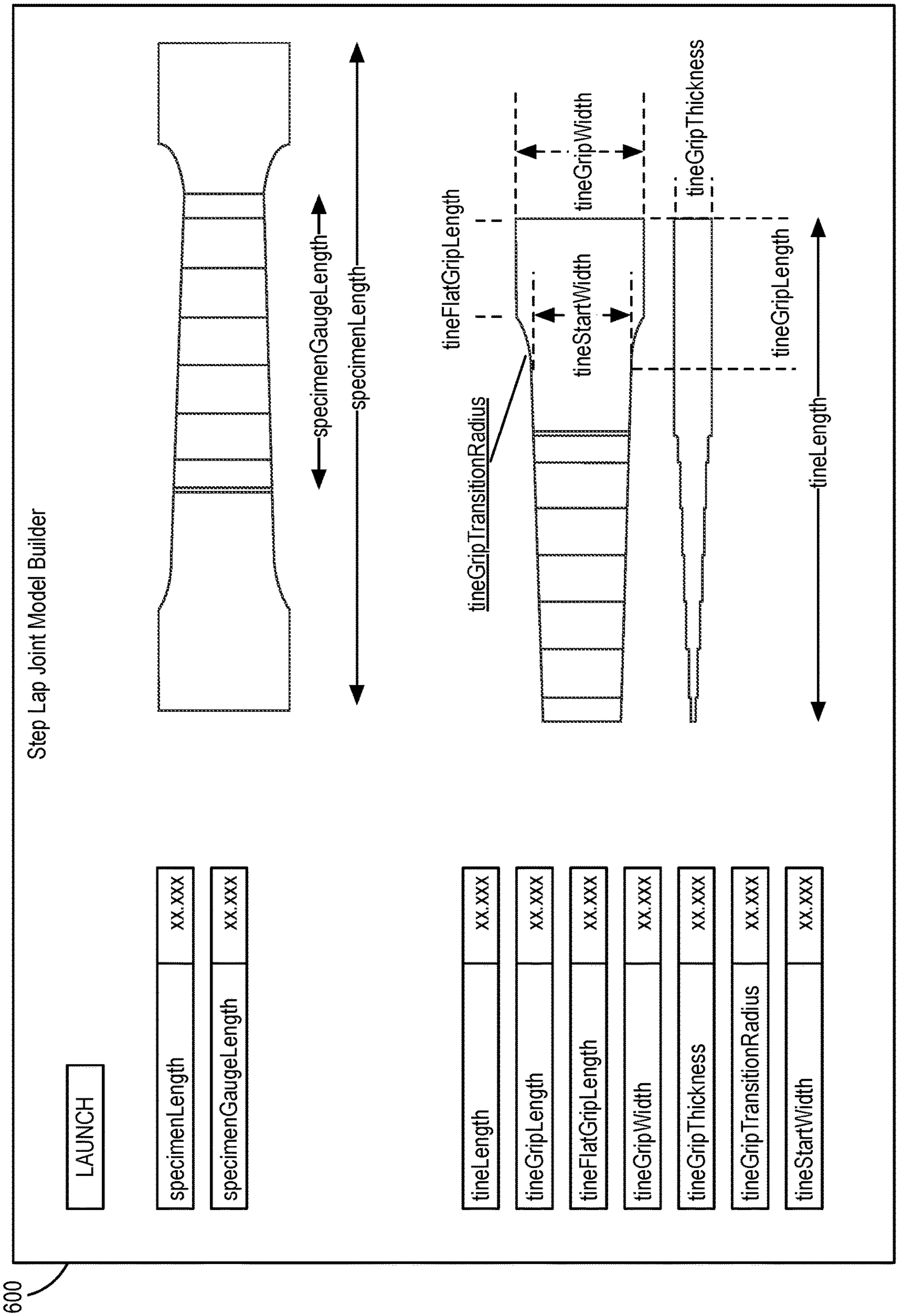
FIG. 6A illustrates a user interface that facilitates specifying parameters associated with a step lap joint, in accordance with example embodiments.

FIG. 6A illustrates an example of a user interface 600 that facilitates specifying geometric parameters associated with a step lap joint. As shown, the user interface 600 facilitates specifying tine parameters that include the overall length, the grip length, the flat grip length, the grip width, the grip thickness, the grip transition radius, the starting width, etc. The user interface 600 also facilitates specifying the specimen gauge length and the specimen length. Some examples of the user interface 600 facilitate specifying material properties associated with the members of the step lap joint.

Figure 6B:
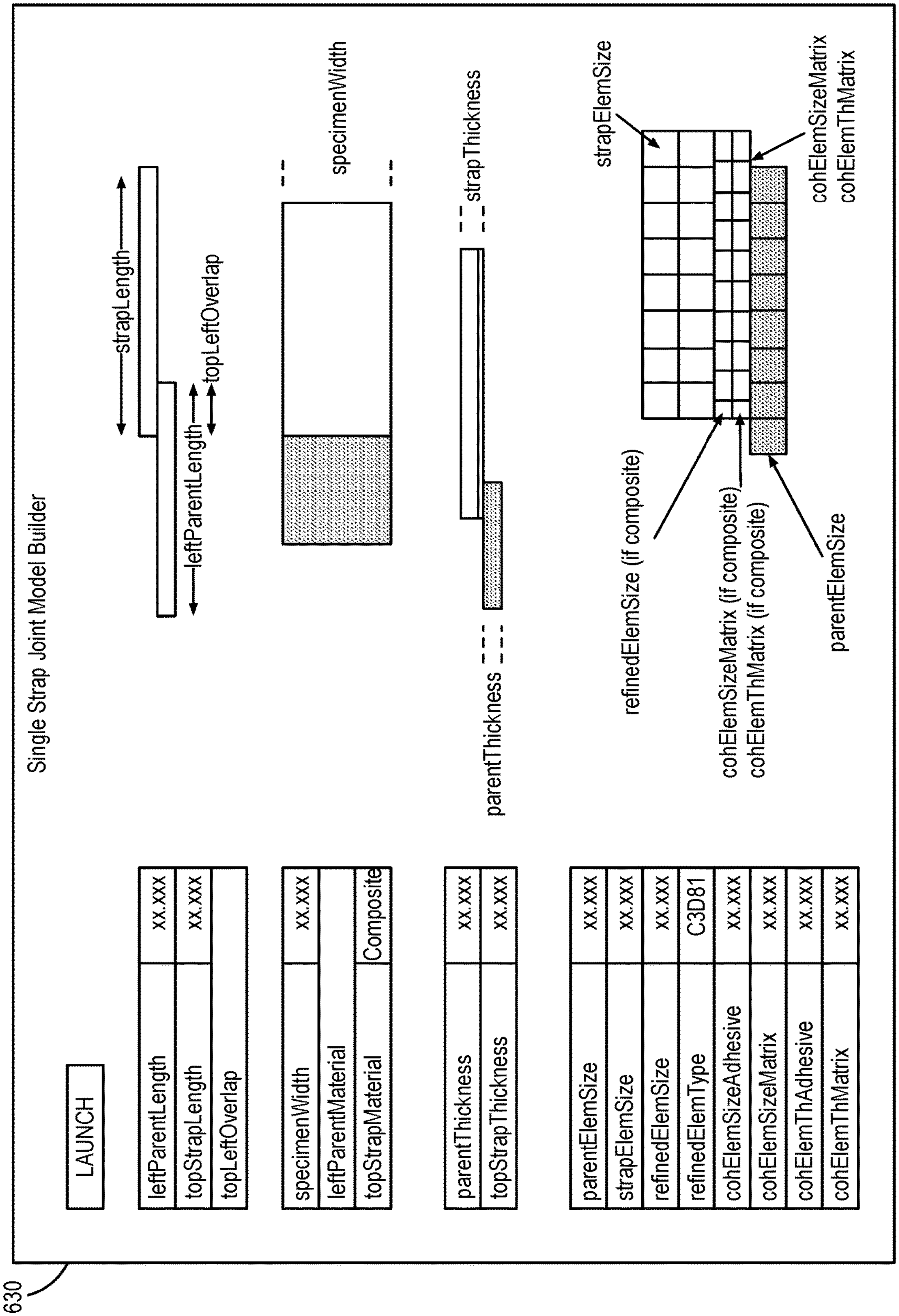
FIG. 6B illustrates a user interface that facilitates specifying parameters associated with a single strap joint, in accordance with example embodiments.

FIG. 6B illustrates an example of a user interface 630 that facilitates specifying geometric parameters associated with a single strap joint. As shown, the user interface 630 facilitates specifying parent parameters that include the length, material, thickness, element size, width, etc. While not illustrated, some examples also facilitate specifying an element type, location for the elements, mesh size, domain for discretization, assignment of linear/nonlinear/custom material properties, assignment of damage modeling approach for each mode of failure to be evaluated, etc. The user interface 660 facilitates specifying strap parameters that include the length, a parent overlap amount, material, thickness, element size, etc. The user interface 660 facilitates specifying parameters that specify the size of the elements (e.g., FEA mesh size) for various aspects. (E.g., parentElemSize for the size of elements in the bulk parent material where damage is not turned on, strapElemSize for the size of elements in the bulk strap material where damage prediction is not turned on, refinedElemSize for the size of elements in the region where damage prediction is turned on for the parent and/or strap materials, refinedElemType for the element type (e.g., solid, shell) desired for damage prediction and associated modeling strategy). Other parameters facilitate specifying similar aspects for the cohesive elements used to model the bondline between the parents/strap (e.g., adhesive interface) and/or the interface between composite plies. Some examples of the user interface 630 facilitate specifying material properties associated with the members of the step lap joint.

Figure 6C:
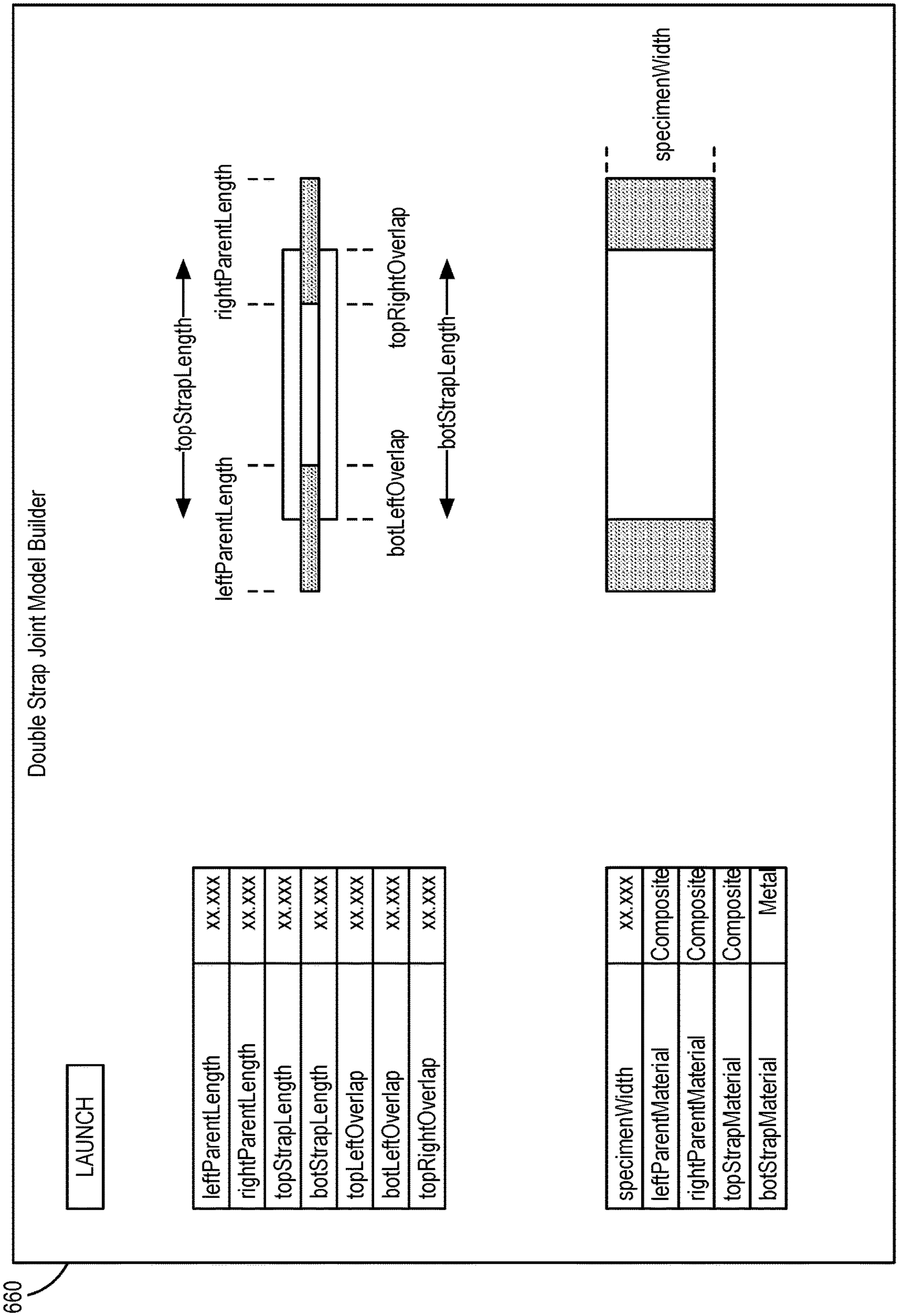
FIG. 6C illustrates a user interface that facilitates specifying parameters associated with a double strap joint, in accordance with example embodiments.

FIG. 6C illustrates an example of a user interface 660 that facilitates specifying geometric parameters associated with a double strap joint. As shown, the user interface 660 facilitates specifying parent parameters that include left and right parent length, material, etc. The user interface 660 facilitates specifying strap parameters that include top and bottom length, a parent overlap amount, material, etc. The user interface 660 facilitates specifying adhesive parameters that include element size and element. The user interface 660 also facilitates specifying the specimen width. Some examples of the user interface 660 facilitate specifying material properties associated with the members of the step lap joint.

The parameters listed above with respect to FIGS. 6A-6C are merely examples. In some examples, additional and/or alternative parameters can be specified. For example, other geometrical attributes of the steplap joint can be evaluated. Damage can also be evaluated at the root of the step surface where the step transitions up to the next step in the joint. The analysis can be applied to both pristine and damaged joints. Further, the root geometry can be set as square/vertical, chamfered, or curved based on design requirements.

The operations at block 510 of FIG. 5 involve selecting a bonded joint model template associated with the specified bonded joint type. In this regard, some examples of the model template repository 130 of the PDAS 105 store model templates associated with different types of bonded joints (e.g., a step lap model template, a single strap model template, a double strap model template, etc.).

Some examples of the bonded joint model template specify a parametrized 3-D representation (e.g., mesh model) of the physical aspects of the bonded joint and specify properties of materials associated with these physical aspects. For instance, some examples of a step lap joint model template specify physical aspects of the step lap joint, such as the configuration of the tine member and ply member, the number of plies, adhesive layers between the tine member and ply member and between layers of the plies, etc. Some examples of the step lap joint model template further specify material properties of the tine member, ply member, adhesive layer, etc. Some examples of the step lap joint model template specify physical aspects of the step lap joint in terms of parameters such as those illustrated in FIG. 6A and described above.

Similarly, some examples of a single strap joint model template and a double strap joint model template specify physical aspects such as the number of plies (if any), adhesive layers between the strap(s) member and parent(s) member and between plies (if any), etc. Some examples of these templates further specify the material properties of the parent member(s), strap member(s), the adhesive layer(s), etc. Some examples of these templates specify physical aspects of the single strap joint and double strap joint in terms of parameters such as those illustrated in FIGS. 6B and 6C, respectively, and described above. It bears repeating that all of these joint types relate directly back to an actual bonded joint such as an aircraft bonded joint, and the criteria relevant to actual aircraft structures.

Some examples of the bonded joint model are configured to model linear and nonlinear behaviors of specified composite materials of the bonded joint. Some examples of the bonded joint model template model are configured to model linear and nonlinear interface behaviors of specified metal materials of the bonded joint. Some examples of the bonded joint model template are configured to model linear and nonlinear interface behaviors of specified adhesives used for bonding members of the bonded joint.

The operations at block 515 involve generating a bonded joint model 220 of the specified bonded joint. In this regard, some examples of the PDAS 105 execute instruction code configured to generate a bonded joint model 220 based on the bonded joint model template. For instance, in some examples, a copy of the bonded joint model template is made. Next, nodes in the copied model template are adjusted according to the bonded joint parameters received above. For example, the nodes are adjusted so that the length, width, thickness, etc., of the joint specified in the copy, conform to the bonded joint parameters.

The operations at block 520 involve simulating the application of one or more stresses on the bonded joint model 220. For instance, the bonded joint model 220 is communicated to FEA logic 125, which is configured to simulate the application of various stresses to the bonded joint model 220. This, in turn, distorts the bonded joint model 220 to a degree. In some examples, stresses that are applied include shearing stresses, bending stresses, etc. Some examples of the stresses correspond to static loading and fatigue loading.

The operations at block 525 involve identifying features in the bonded joint model 220 that correspond to defects and tracking changes in the size of these defects. FIGS. 7A-7I illustrate an example of defects (705, 710, 715) in a bonded joint. Some examples of the defect correspond to disbonds or cracks that develop between the bond line of the bonded joint (e.g., a disbonds or crack between the parent member and the strap of a single or double strap joint). Some examples of the defect correspond to disbonds or cracks between plies of the bonded joint (e.g., disbonds or cracks between plies of the ply member of a step lap joint.) Some examples of the defect correspond to disbonds or cracks within the member components of the bonded joint (e.g., disbonds or cracks within the parent member and/or strap member of a single and/or double strap joint, a particular ply and/or the tine member of a step lap joint, etc.). Some examples of the defect correspond to disbonds or cracks within one or more adhesive layers of the bonded joint.

In some examples, the operations between blocks 520 and 525 are repeated a number of times, N, to simulate repeated stress cycles. In some examples, defects (705, 710, 715) identified in the bonded joint model 220 increase (e.g., a particular disbonds or crack grows in length) with repeated cycles. For example, the defect in FIGS. 7A, 7D, and 7G may have developed after 1000 simulated stress cycles. After another 1000 simulated stress cycles, the defect (705, 710, 715) may have grown to the level illustrated in FIGS. 7B, 7E, and 7H. After yet another 1000 simulated stress cycles, the defect (705, 710, 715) may have grown to the level illustrated in FIGS. 7C, 7F, and 7I.

While the operations are described above as being iterative, in some examples, a non-iterative process (e.g., straight-through process) utilizing a single analysis that involves multiple solver steps is utilized.

Figures 7A, 7B, 7C:
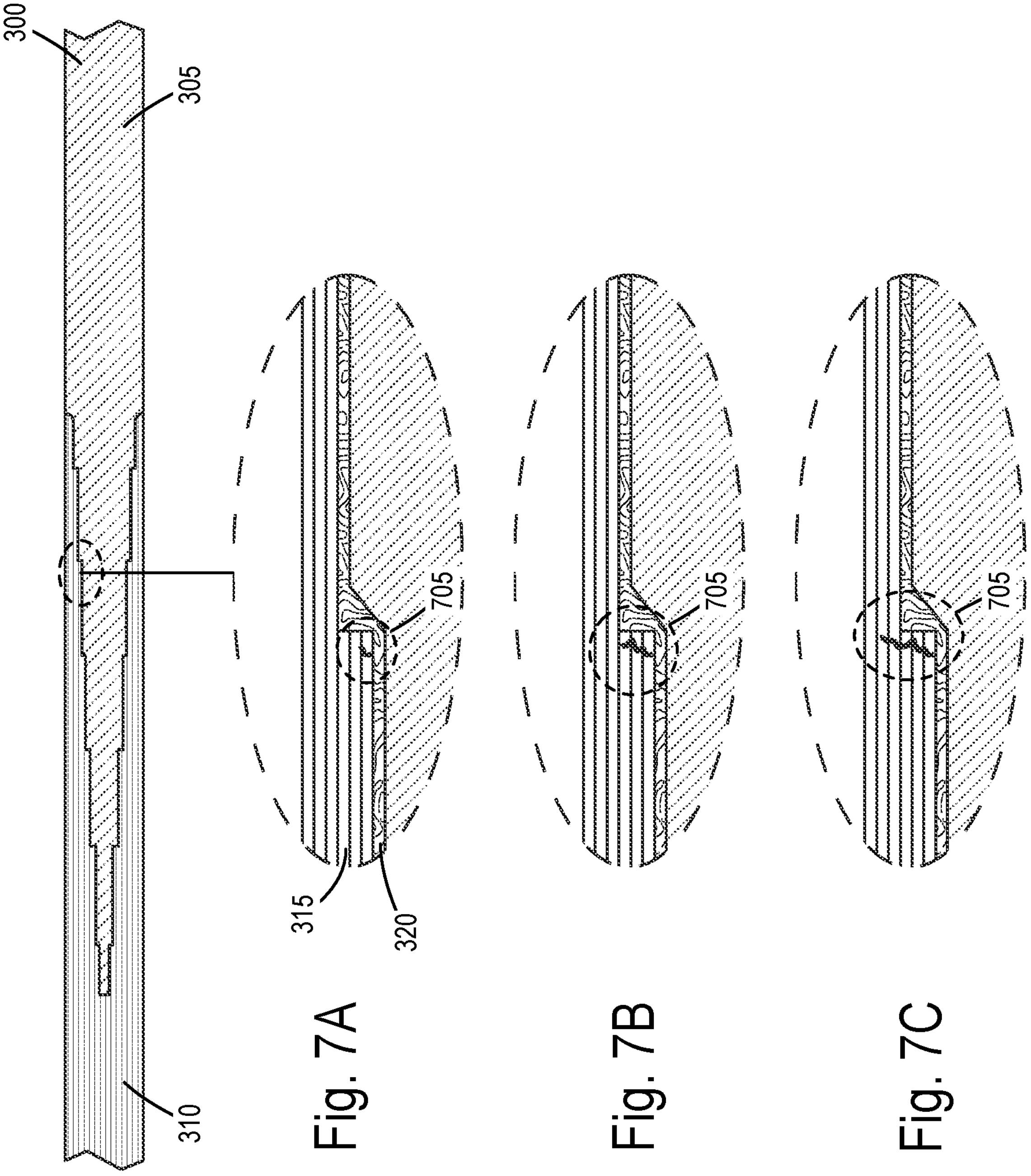
FIG. 7A illustrates an intralaminar defect in a bonded joint, in accordance with example embodiments.
FIG. 7B illustrates the intralaminar defect in the bonded joint after first stress cycles, in accordance with example embodiments.
FIG. 7C illustrates the intralaminar defect in the bonded joint after second stress cycles, in accordance with example embodiments.
Figures 7D, 7E, 7F:
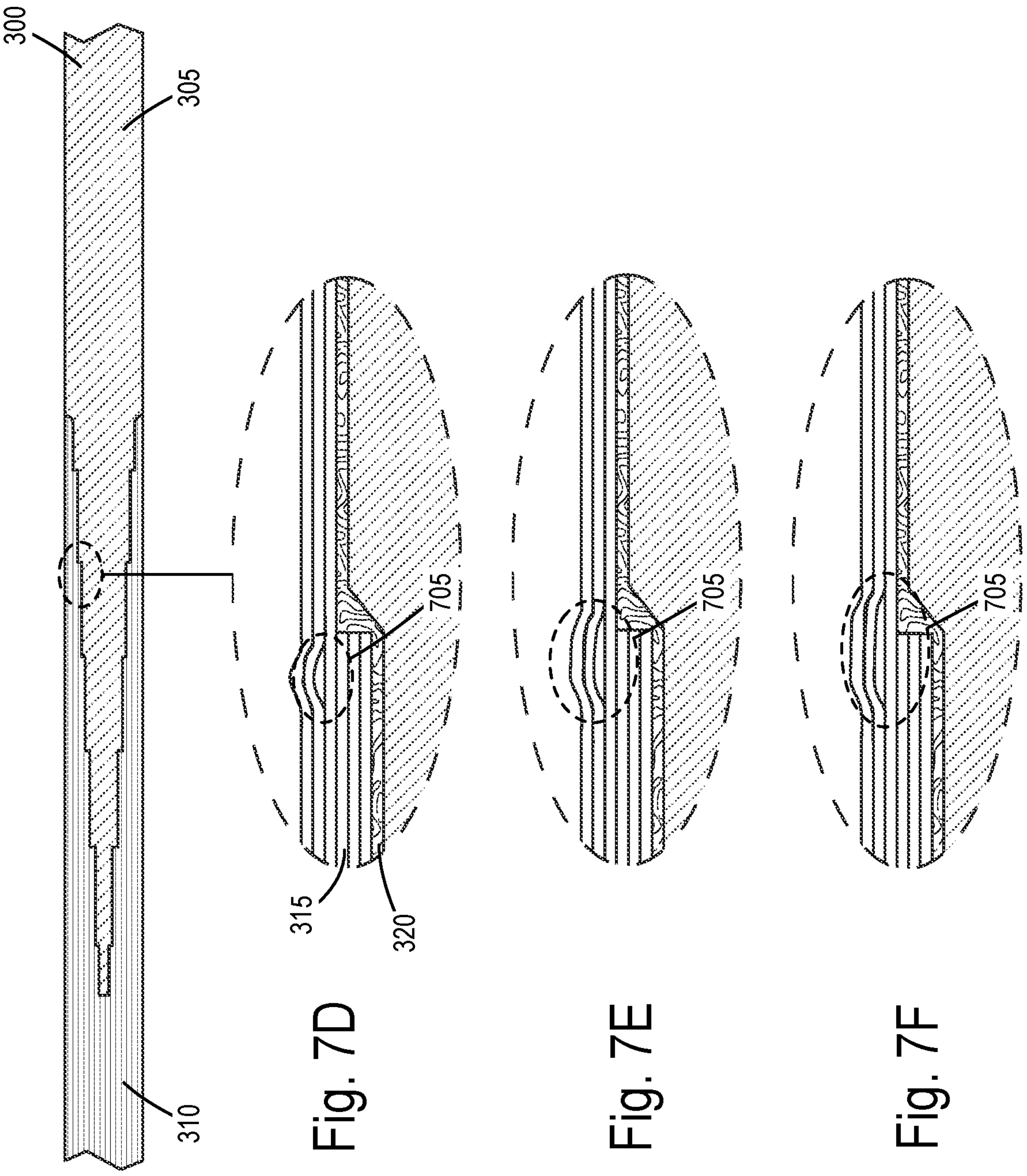
FIG. 7D illustrates a disbond between composite plies of a bonded joint, in accordance with example embodiments.
FIG. 7E illustrates the disbond after first stress cycles, in accordance with example embodiments.
FIG. 7F illustrates the disbond after second stress cycles, in accordance with example embodiments.
Figure 7G:
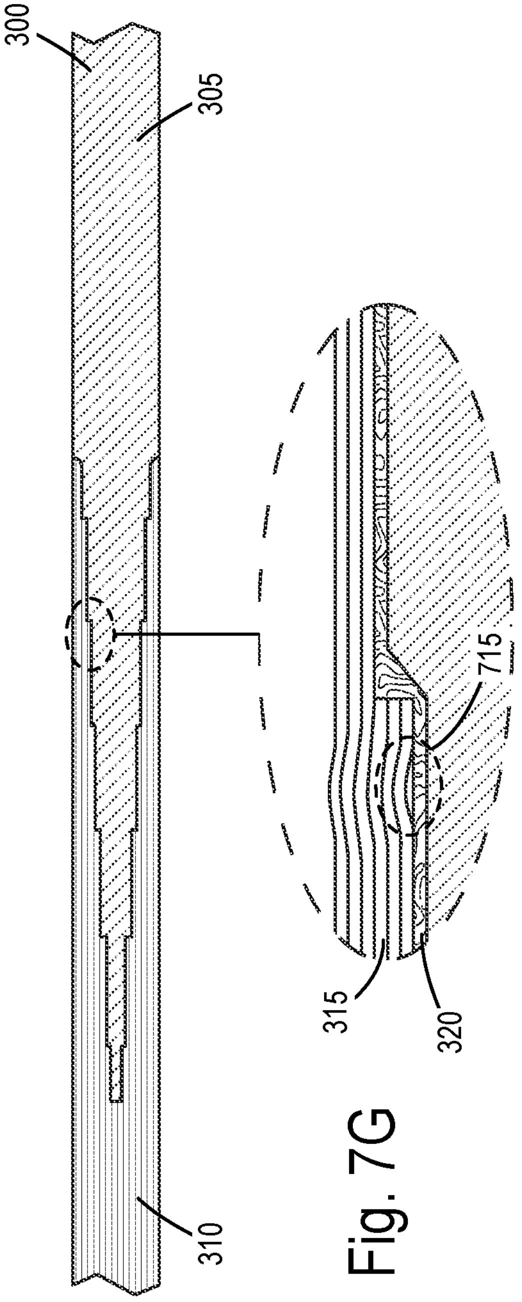
FIG. 7G illustrates a disbond between a composite and metal interface in a bonded joint, in accordance with example embodiments.
Figure 7H:
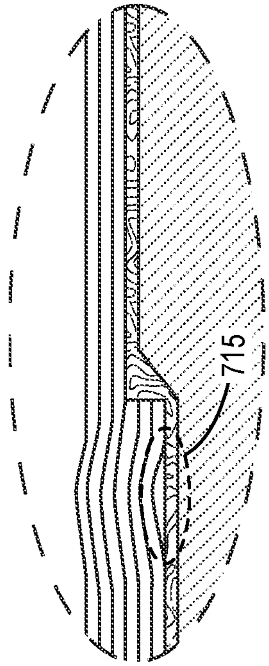
FIG. 7H illustrates the disbond in the bonded joint after first stress cycles, in accordance with example embodiments.
Figure 7I:
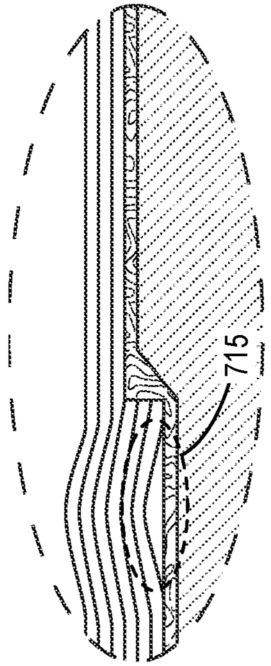
FIG. 7I illustrates the disbond in the bonded joint after second stress cycles, in accordance with example embodiments.

The operations at block 530 involve determining the life expectancy of the bonded joint. In some examples, this involves determining the number of cycles required for one or more defects to grow to a particular size deemed to be associated with failure of the bonded joint. In this regard, the determined life expectancy may correspond to a number of cycles required to cause the defect to grow to a particular size. For instance, in some examples, if the size of the defect (705, 710, 715) of the bonded joint of FIG. 7C, 7F, or 7I is considered a failure and if 3000 simulated stress cycles were required for the defect (705, 710, 715) to grow to the illustrated size, the life expectancy of a corresponding bonded joint is determined to be 3000 stress cycles.

The operations described above facilitate determining the life expectancy of a pristine bonded joint (e.g., a bonded joint that does not start out with any particular defects). The operations at block 535 involve specifying defects in the bonded joint. In particular, examples of these operations involve specifying a starting point of a defect and/or an initial size of the defect. For instance, some examples of the PDAS 105 communicate a user interface that facilitates specifying a defect, such as the defect (705, 710, 715) illustrated in any of FIGS. 7A-7I.

Some examples of the PDAS 105 are configured to facilitate specifying one or more defects at various locations along the bondline between the bonded joint, between one or more plies of a bonded joint, at one or more different steps of the bonded joint, etc. In this regard, some examples of the PDAS 105 communicate a user interface that facilitates the specification of particular locations and/or sizes of defects to apply to the bonded joint. These defects are then implemented in the bonded joint model at block 515, which is evaluated in subsequent operations.

Some examples of the PDAS 105 facilitate specification of one or more defects via the bonded joint parameters 170. In this regard, some examples of the bonded joint parameters 170 facilitate the specification of an amount of fatigue loading experienced by the bonded joint. Some examples of the PDAS 105 generate a defect in the bonded joint model 220 that corresponds with the amount of fatigue loading. For instance, the size of the defect is increased with larger degrees of fatigue loading.

Figure 8:
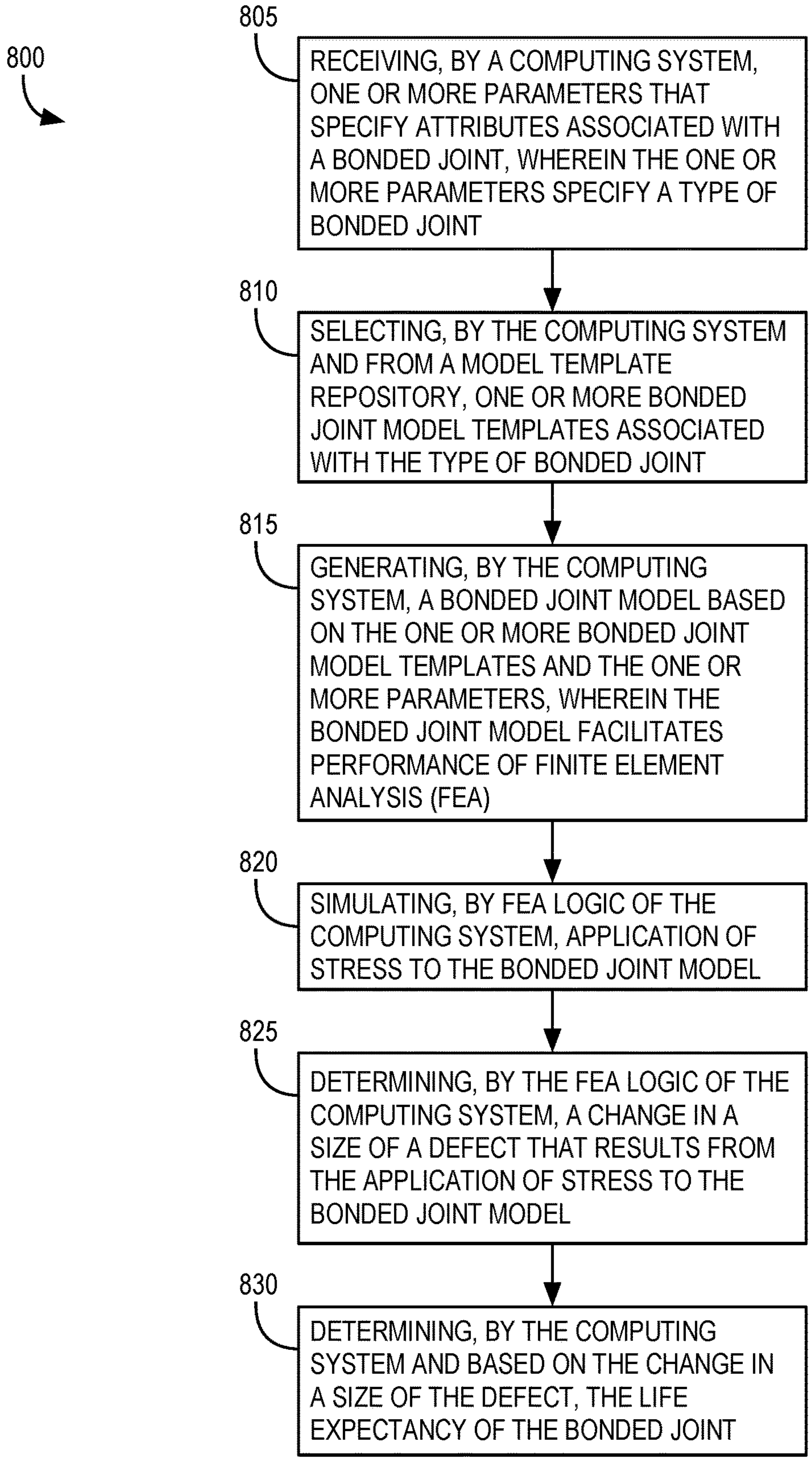
FIG. 8 illustrates operations performed by one or more devices described herein, in accordance with example embodiments.

FIG. 8 illustrates an example of operations 800 performed by some examples of the devices described herein. The operations at block 805 involve receiving, by a computing system, one or more parameters that specify attributes associated with a bonded joint, wherein the one or more parameters specify a type of bonded joint.

The operations at block 810 involve selecting, by the computing system and from a model template repository, one or more bonded joint model templates associated with the type of bonded joint.

The operations at block 815 involve generating, by the computing system, a bonded joint model based on the one or more bonded joint model templates and the one or more parameters, wherein the bonded joint model facilitates the performance of finite element analysis (FEA).

The operations at block 820 involve simulating, by FEA logic of the computing system, the application of stress to the bonded joint model.

The operations at block 825 involve determining, by the FEA logic of the computing system, a change in a size of a defect that results from the application of stress to the bonded joint model.

The operations at block 830 involve determining, by the computing system and based on the change in the size of the defect, the life expectancy of the bonded joint.

Some examples of the operations further involve specifying, in the bonded joint model, a starting point and an initial size of a defect prior to the simulating of the application of stress to the bonded joint model.

In some examples, specifying the starting point and the initial size of the defect involves specifying one or more defects at one or more different locations along a bondline of the bonded joint. In these examples, determining the change in the size of the defect involves determining changes in sizes in each of the one or more defects.

In some examples, specifying the starting point and the initial size of the defect involves specifying one or more defects at one or more different steps of a step lap joint. In these examples, determining the change in the size of the defect involves determining changes in sizes in each of the one or more defects.

In some examples, the bonded joint model specifies a member having a plurality of plies. In these examples, specifying the starting point and the initial size of the defect involves specifying one or more defects between one or more plies of the ply member, and determining the change in the size of the defect involves determining changes in each of the one or more defects.

In some examples, receiving one or more parameters that specify attributes associated with the bonded joint involves receiving one or more parameters that specify one or more parameters that specify a 3-dimensional geometry of the bonded joint. In these examples, receiving one or more parameters that specify a type of bonded joint involves receiving one or more parameters that specify one of: a single strap joint, a double strap joint, and a step lap joint.

In some examples, selecting one or more model templates from the model template repository associated with the type of bonded joint involves selecting one or more model templates that model linear and nonlinear behaviors of a composite material of the bonded joint, model linear and nonlinear behaviors of a metal material of the bonded joint, and model linear and nonlinear interface behaviors of an adhesive used for bonding plies of the bonded joint.

In some examples, simulating the application of stress to the bonded joint model involves simulating the application of one or more of: static loading and fatigue loading to the bonded joint model.

Figure 9:
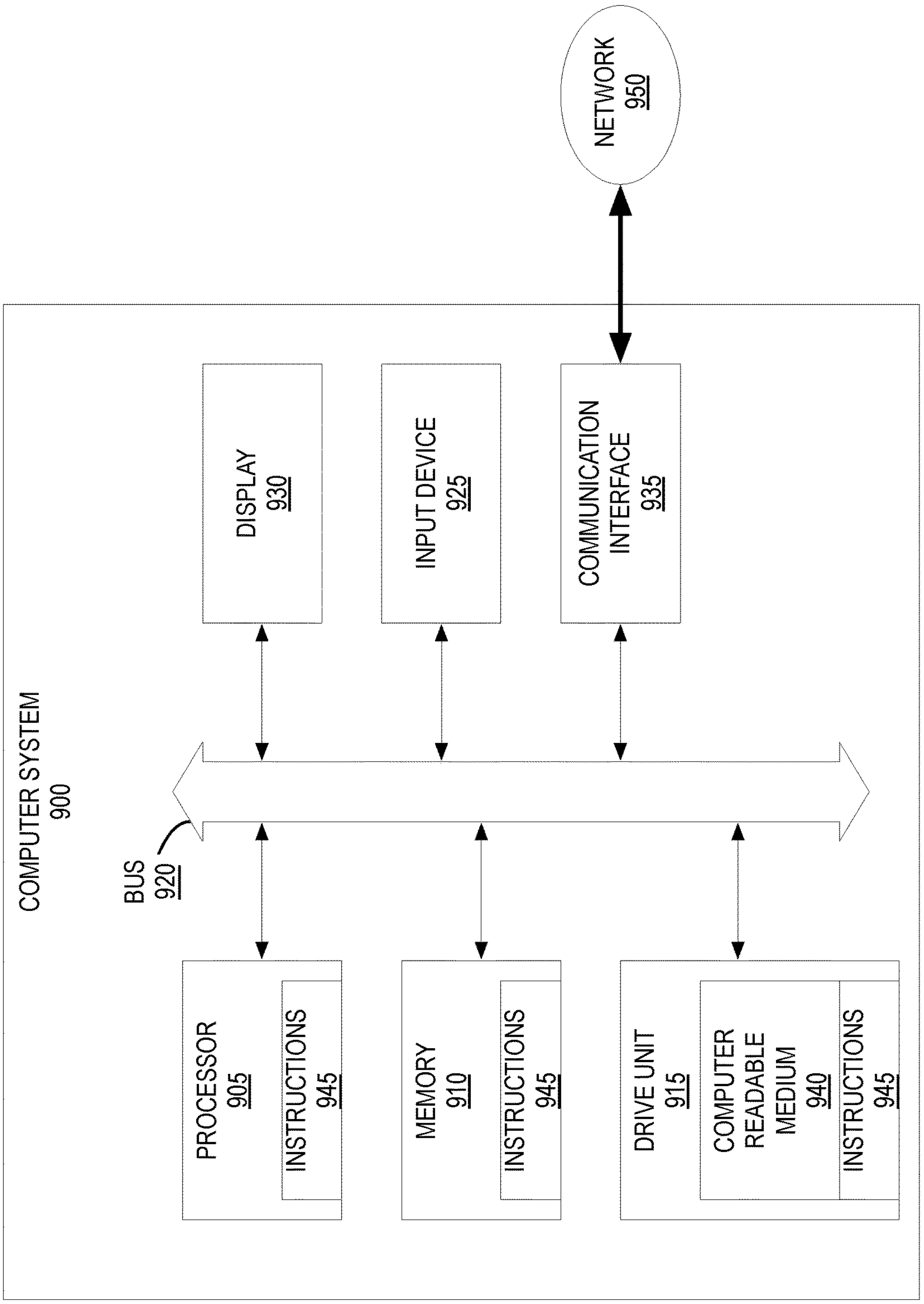
FIG. 9 illustrates a computer system, in accordance with example embodiments.

FIG. 9 illustrates an example of a computer system 900 that can form part of or implement any of the systems and/or devices described above. Some examples of the computer system 900 include a set of instructions 945 that the processor 905 can execute to cause the computer system 900 to perform any of the operations described above. Some examples of the computer system 900 operate as a standalone device or can be connected, e.g., using a network, to other computer systems or peripheral devices.

In a networked example, some examples of the computer system 900 operate in the capacity of a server or as a client computer in a server-client network environment, or as a peer computer system in a peer-to-peer (or distributed) environment. Some examples of the computer system 900 are implemented as or incorporated into various devices, such as a personal computer or a mobile device, capable of executing instructions 945 (sequential or otherwise), causing a device to perform one or more actions. Further, some examples of the systems described include a collection of subsystems that individually or jointly execute a set, or multiple sets, of instructions to perform one or more computer operations.

Some examples of the computer system 900 include one or more memory devices 910 communicatively coupled to a bus 920 for communicating information. In addition, in some examples, code operable to cause the computer system to perform operations described above is stored in the memory 910. Some examples of the memory 910 are random-access memory, read-only memory, programmable memory, hard disk drive, or any other type of memory or storage device.

Some examples of the computer system 900 include a display 930, such as a liquid crystal display (LCD), organic light-emitting diode (OLED) display, or any other display suitable for conveying information. Some examples of the display 930 act as an interface for the user to see processing results produced by processor 905.

Additionally, some examples of the computer system 900 include an input device 925, such as a keyboard or mouse or touchscreen, configured to allow a user to interact with components of system 900.

Some examples of the computer system 900 include a drive unit 915 (e.g., flash storage). Some examples of the drive unit 915 include a computer-readable medium 940 in which the instructions 945 can be stored. Some examples of the instructions 945 reside completely, or at least partially, within the memory 910 and/or within the processor 905 during execution by the computer system 900. Some examples of the memory 910 and the processor 905 include computer-readable media, as discussed above.

Some examples of the computer system 900 include a communication interface 935 to support communications via a network 950. Some examples of the network 950 include wired networks, wireless networks, or combinations thereof. Some examples of the communication interface 935 facilitate communications via any number of wireless broadband communication standards, such as the Institute of Electrical and Electronics Engineering (IEEE) standards 802.11, 802.12, 802.16 (WiMAX), 802.20, cellular telephone standards, or other communication standards.

Accordingly, some examples of the methods and systems described herein are realized in hardware, software, or a combination of hardware and software. Some examples of the methods and systems are realized in a centralized fashion in at least one computer system or in a distributed fashion where different elements are spread across interconnected computer systems. Any kind of computer system or other apparatus adapted for carrying out the methods described herein can be employed.

Some examples of the methods and systems described herein are embedded in a computer program product, which includes all the features that facilitate the implementation of the operations described herein and which, when loaded in a computer system, cause the computer system to perform these operations. A computer program as used herein refers to an expression, in a machine-executable language, code or notation, of a set of machine-executable instructions intended to cause a device to perform a particular function, either directly or after one or more of a) conversion of a first language, code, or notation to another language, code, or notation; and b) reproduction of a first language, code, or notation.

While the systems and methods of operation have been described with reference to certain examples, it will be understood by those skilled in the art that various changes can be made, and equivalents can be substituted without departing from the scope of the claims. Therefore, it is intended that the present methods and systems are not limited to the particular examples disclosed but that the disclosed methods and systems include all embodiments falling within the scope of the appended claims.

The invention claimed is:

1. A computer-implemented method that facilitates determining a life expectancy of a bonded joint, the method comprising:

receiving, by a computing system, one or more parameters that specify attributes associated with a bonded joint, wherein the one or more parameters specify a type of bonded joint;

selecting, by the computing system and from a model template repository, one or more bonded joint model templates associated with the type of bonded joint, wherein the one or more bonded joint model templates are configured to model one or more of:

linear and nonlinear behaviors of composite materials of the bonded joint, or linear and nonlinear interface behaviors of metal materials of the bonded joint;

generating, by the computing system, a bonded joint model based on the one or more bonded joint model templates and the one or more parameters, wherein the bonded joint model facilitates performance of finite element analysis (FEA);

simulating, by FEA logic of the computing system, application of stress to the bonded joint model;

determining, by the FEA logic of the computing system, a change in a size of a defect that results from the application of stress to the bonded joint model;

determining, by the computing system and based on the change in a size of the defect, the life expectancy of the bonded joint; and providing, by the computing system, a damage analysis report with the life expectancy of the bonded joint.

2. The computer-implemented method according to claim 1, further comprising:

specifying, in the bonded joint model, a starting point and an initial size of a defect prior to the simulating of the application of stress to the bonded joint model.

3. The computer-implemented method according to claim 2, wherein specifying the starting point and the initial size of the defect comprises:

specifying one or more defects at one or more different locations along a bondline of the bonded joint; and wherein determining the change in the size of the defect comprises determining changes in sizes in each of the one or more defects.

4. The computer-implemented method according to claim 2, wherein specifying the starting point and the initial size of the defect comprises:

specifying one or more defects at one or more different steps of a step lap joint; and wherein determining the change in the size of the defect comprises determining changes in sizes in each of the one or more defects.

5. The computer-implemented method according to claim 2, wherein the bonded joint model specifies a ply member having a plurality of plies, wherein specifying the starting point and the initial size of the defect comprises:

specifying one or more defects between one or more plies of the ply member; and wherein determining the change in the size of the defect comprises determining changes in each of the one or more defects.

6. The computer-implemented method according to claim 1, wherein receiving one or more parameters that specify attributes associated with the bonded joint comprises:

receiving one or more parameters that specify one or more parameters that specify a 3-dimensional geometry of the bonded joint; and wherein receiving one or more parameters that specify a type of bonded joint comprises receiving one or more parameters that specify one of: a single strap joint, a double strap joint, and a step lap joint.

7. The computer-implemented method according to claim 1, wherein simulating the application of stress to the bonded joint model comprises:

simulating application of one or more of: static loading and fatigue loading to the bonded joint model.

8. The computer-implemented method according to claim 1, wherein the application of stress corresponds to the application of one or more of:

a mechanical stress, a thermal stress, or a hygric stress.

9. A computing system that facilitates determining a life expectancy of a bonded joint, the computing system comprising:

one or more instruction storage devices for storing instruction code; and one or more processors in communication with the one or more instruction storage devices, the one or more processors are configured to:

receive one or more parameters that specify attributes associated with a bonded joint, wherein the one or more parameters specify a type of bonded joint;

select, from a model template repository, one or more bonded joint model templates associated with the type of bonded joint, wherein the one or more bonded joint model templates are configured to model two or more of:

linear and nonlinear behaviors of composite materials of the bonded joint, linear and nonlinear interface behaviors of metal materials of the bonded joint, or linear and nonlinear interface behaviors of adhesives materials of the bonded joint;

generate a bonded joint model based on the one or more bonded joint model templates and the one or more parameters, wherein the bonded joint model facilitates performance of finite element analysis (FEA);

simulate, using FEA logic, application of stress to the bonded joint model;

determine, using the FEA logic, a change in a size of a defect that results from the application of stress to the bonded joint model;

determine, based on the change in a size of the defect, the life expectancy of the bonded joint; and provide a damage analysis report to facilitate estimating longevity of the bonded joint associated with the bonded joint model.

10. The computing system according to claim 9, wherein the application of stress corresponds to the application of one or more of:

a thermal stress at a certain frequency, or a hygric stress at a certain frequency.

11. The computing system according to claim 10, wherein the one or more processors are further configured to:

specify, in the bonded joint model, a starting point and an initial size of a defect prior to the simulating of the application of stress to the bonded joint model.

12. The computing system according to claim 11, wherein the one or more processors, when specifying the starting point and the initial size of the defect, are configured to:

specify one or more defects at one or more different locations along a bondline of the bonded joint; and wherein the one or more processors, when determining the change in the size of the defect are configured to:

determine changes in sizes in each of the one or more defects.

13. The computing system according to claim 11, wherein the one or more processors, when specifying the starting point and the initial size of the defect, are configured to:

specify one or more defects at one or more different steps of a step lap joint; and wherein the one or more processors, when determining the change in the size of the defect, are configured to:

determine changes in sizes in each of the one or more defects.

14. The computing system according to claim 11, wherein the bonded joint model specifies a ply member having a plurality of plies, wherein the one or more processors, when specifying the starting point and the initial size of the defect are configured to:

specify one or more defects between one or more plies of the ply member; and wherein the one or more processors, when determining the change in the size of the defect, are configured to:

determine changes in each of the one or more defects.

15. The computing system according to claim 11, wherein the one or more processors, when receiving one or more parameters that specify attributes associated with the bonded joint, are configured to:

receive one or more parameters that specify one or more parameters that specify a 3-dimensional geometry of the bonded joint; and wherein the one or more processors, when receiving one or more parameters that specify a type of bonded joint, are configured to:

receive one or more parameters that specify one of: a single strap joint, a double strap joint, and a step lap joint.

16. The computing system according to claim 10, wherein the one or more processors, when simulating the application of stress to the bonded joint model, are configured to:

simulate application of one or more of: static loading and fatigue loading to the bonded joint model.

17. A non-transitory computer-readable medium that stores instruction code that facilitates determining a life expectancy of a bonded joint, wherein execution of the instruction code by one or more processors of a computing system causes the computing system to:

receive one or more parameters that specify attributes associated with a bonded joint, wherein the one or more parameters specify a type of bonded joint;

select, from a model template repository, one or more bonded joint model templates associated with the type of bonded joint;

generate a bonded joint model based on the one or more bonded joint model templates and the one or more parameters, wherein the bonded joint model facilitates performance of finite element analysis (FEA);

simulate, using FEA logic, application of stress to the bonded joint model;

determine, using FEA logic, a change in a size of a defect that results from the application of stress to the bonded joint model;

determine, based on the change in a size of the defect, the life expectancy of the bonded joint; and provide a damage analysis report to facilitate estimating longevity of the bonded joint associated with the bonded joint model.

18. The non-transitory computer-readable medium according to claim 17, wherein the instruction code further causes the computing system to:

specify, in the bonded joint model, a starting point and an initial size of a defect prior to the simulating of the application of stress to the bonded joint model.

19. The non-transitory computer-readable medium according to claim 18, wherein instruction code, to specify the starting point and the initial size of the defect, causes the computing system to:

specify one or more defects at one or more different locations along a bondline of the bonded joint; and wherein instruction code, to determine the change in the size of the defect, cause the computing system to:

determine changes in sizes in each of the one or more defects.

20. The non-transitory computer-readable medium according to claim 18, wherein specifying the starting point and the initial size of the defect comprises:

specifying one or more defects at one or more different steps of a step lap joint; and wherein instruction code, to determine the change in the size of the defect, causes the computing system to:

determine changes in sizes in each of the one or more defects.

* * * * *